(12) United States Patent
Kobayashi

(10) Patent No.: US 8,613,500 B2
(45) Date of Patent: Dec. 24, 2013

(54) PIEZOELECTRIC ACTUATOR, LIQUID DISCHARGE HEAD, AND METHOD OF MANUFACTURING SAME

(75) Inventor: Yasunori Kobayashi, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 30 days.

(21) Appl. No.: 12/891,850

(22) Filed: Sep. 28, 2010

(65) Prior Publication Data

US 2011/0128328 A1 Jun. 2, 2011

(30) Foreign Application Priority Data

Nov. 30, 2009 (JP) ................................ 2009-271391

(51) Int. Cl.
*B41J 2/045* (2006.01)
*H01L 41/047* (2006.01)
*H01L 41/22* (2013.01)

(52) U.S. Cl.
USPC ............................. 347/71; 310/364; 29/25.35

(58) Field of Classification Search
None
See application file for complete search history.

(56) References Cited

U.S. PATENT DOCUMENTS

| | | | |
|---|---|---|---|
| 7,294,952 B2 | 11/2007 | Ito | |
| 7,416,279 B2 * | 8/2008 | Isono | ............................. 347/50 |
| 7,802,876 B2 | 9/2010 | Okawa et al. | |
| 7,882,607 B2 | 2/2011 | Li | |
| 2003/0112298 A1 | 6/2003 | Sato et al. | |
| 2004/0125177 A1 | 7/2004 | Sakaida et al. | |
| 2005/0168537 A1 | 8/2005 | Hibi | |
| 2005/0253488 A1 | 11/2005 | Ito | |
| 2008/0088207 A1 | 4/2008 | Li | |
| 2009/0002462 A1 | 1/2009 | Okawa et al. | |
| 2009/0219345 A1 * | 9/2009 | Yazaki et al. | ................... 347/68 |
| 2009/0244209 A1 | 10/2009 | Shimada | |

FOREIGN PATENT DOCUMENTS

| | | |
|---|---|---|
| CN | 101327683 A | 12/2008 |
| CN | 101544113 A | 9/2009 |
| JP | HEI 04-096286 A | 3/1992 |
| JP | 11-070653 A | 3/1999 |
| JP | 2003-174056 A | 6/2003 |
| JP | 2005-322850 A | 11/2005 |
| JP | 2007-012825 A | 1/2007 |
| JP | 2009-006616 A | 1/2009 |
| JP | 2009-078564 A | 4/2009 |

OTHER PUBLICATIONS

Wikipedia Article: Transition Metals.*
JP Office Action dtd Dec. 6, 2011, JP Appln. 2009-271391, English translation.
CN Office Action dtd Nov. 30, 2012, CN Appln. 201010505366.6, English translation.
Communication, issued Aug. 15, 2013, in corresponding European Patent Application No. 10010214.4.

* cited by examiner

Primary Examiner — Lisa M Solomon
(74) Attorney, Agent, or Firm — Banner & Witcoff, Ltd.

(57) ABSTRACT

A piezoelectric actuator may include a piezoelectric layer. The piezoelectric actuator may also include an electrode layer which is disposed on a surface of the piezoelectric layer. The piezoelectric actuator may further include a metal terminal which is disposed on the electrode layer, and configured as a contact point with respect to an external terminal. The piezoelectric actuator may yet further include a metal layer which is disposed between the piezoelectric layer and each of the metal terminal and the electrode layer.

14 Claims, 8 Drawing Sheets

PIEZOELECTRIC ACTUATOR, LIQUID DISCHARGE HEAD, AND METHOD OF MANUFACTURING SAME

CROSS REFERENCE TO RELATED APPLICATION

This application claims priority to Japanese Patent Application No. 2009-271391, filed Nov. 30, 2009, the entire subject matter and disclosure of which is incorporated herein by reference.

BACKGROUND OF THE DISCLOSURE

1. Field of the Disclosure

Aspects relate to a piezoelectric actuator including an electrode layer which is disposed on a surface of a piezoelectric layer and an electrode terminal which is disposed such that the electrode layer is interposed between the piezoelectric layer and the electrode terminal. Aspects also relate to a liquid discharge head including the piezoelectric actuator, and methods of manufacturing the piezoelectric actuator and the liquid discharge head including the piezoelectric actuator.

2. Description of the Related Art

A known liquid discharge head which is configured to discharge liquid from a plurality of discharge ports includes piezoelectric actuators which are configured to apply discharging energy to the liquid in pressure chambers which communicate with the discharge ports, respectively. The piezoelectric actuators each include a piezoelectric layer such as PZT for example, a common electrode, and a plurality of individual electrodes. The common electrode is disposed to span the pressure chambers, which are in fluid communication with the respective discharge ports, and maintained at a predetermined potential. The individual electrodes are disposed at positions overlapping the pressure chambers such that the piezoelectric layer is interposed between the common electrode and the individual electrodes. A metal terminal is disposed on each individual electrode, and a wiring member is connected to the metal terminal. When a voltage is applied to the individual electrode via the wiring member, a potential difference is developed between the individual electrode and the common electrode. Consequently, the piezoelectric layer is changed in shape, the capacity of the pressure chamber is changed, and the liquid in the pressure chamber is compressed, such that the liquid is discharged from the discharge port.

However, the piezoelectric actuator as described above may be cracked by a force which is applied thereto when handling the piezoelectric actuator. If a crack extending from the metal terminal to the common electrode occurs, migration (i.e., a phenomenon in which a metal ion moves from the metal terminal to the common electrode) may occur, which could cause deteriorated insulation. Consequently, the discharge ports may be not able to discharge the liquid.

SUMMARY OF THE DISCLOSURE

Aspects relate to a piezoelectric actuator including an electrode layer which is disposed on a surface of a piezoelectric layer and an electrode terminal which is disposed such that the electrode layer is interposed between the piezoelectric layer and the electrode terminal. Aspects also relate to a liquid discharge head including the piezoelectric actuator, and methods of manufacturing the piezoelectric actuator and the liquid discharge head including the piezoelectric actuator.

Other aspects, features, and advantages of embodiments of the disclosure will be apparent to persons of ordinary skill in the art from the following description of illustrative embodiments with reference to the accompanying drawings.

BRIEF DESCRIPTION OF THE DRAWINGS

Illustrative embodiments of an ink-jet printer including ink-jet heads and a method of manufacturing an ink-jet head are described with reference to the accompanying drawings, which are given by way of example only, and are not intended to limit the present patent.

DETAILED DESCRIPTION

Various illustrative embodiments and their features and advantages, may be understood by referring to FIGS. 1-8, like numerals being used for corresponding parts in the various drawings.

Figure 1:
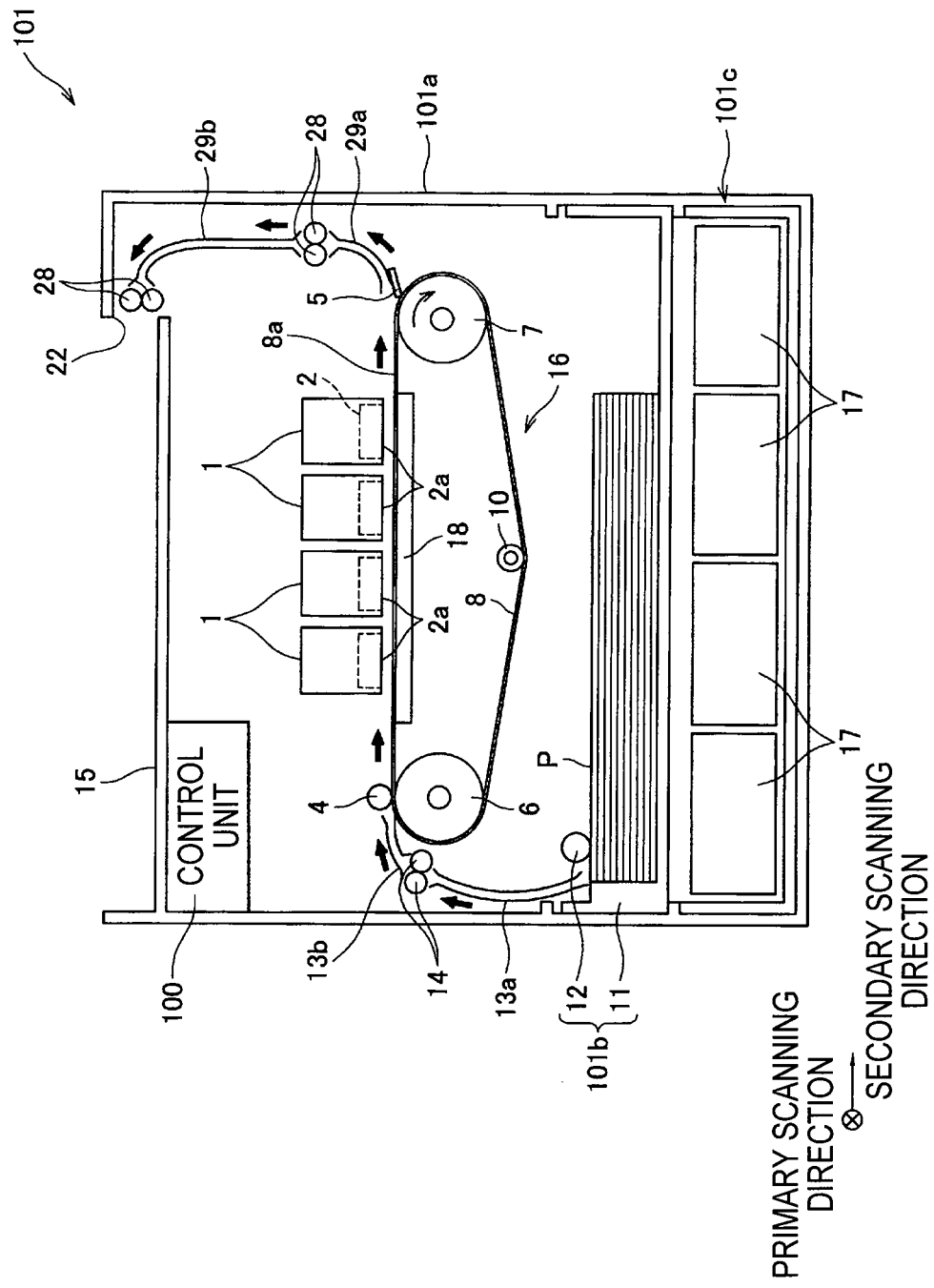
FIG. 1 is a schematic side view showing a general configuration of an ink-jet printer according to an illustrative embodiment.

Referring to FIG. 1, an ink-jet head 1 according to an illustrative embodiment may be disposed in an ink-jet printer 101. The ink-jet printer 101 may include a housing 101a of a parallelepiped shape. The housing 101a may include at least the following devices disposed therein, a plurality of e.g., four, ink-jet heads 1 configured to discharge ink downward, a transporting device 16 configured to transport a paper P, a paper feed unit 101b configured to feed the paper P, and a tank unit 101c configured to store the ink. A control unit 100 which is configured to control operations of the respective devices may be disposed at a position to avoid interference with the devices. A paper output portion 15 may be disposed on an upper portion of a top plate of the housing 101a, such that the paper P is discharged on the paper output portion 15.

The plurality of e.g., four, ink-jet heads 1 each may have a substantially parallelepiped shape elongated in a primary scanning direction, and may be arranged and secured along the transport direction (i.e., secondary scanning direction) of the paper P. The ink-jet printer 101 may be a line-type printer. The transport direction and the primary scanning direction may have a relation orthogonal to each other.

Figure 4:
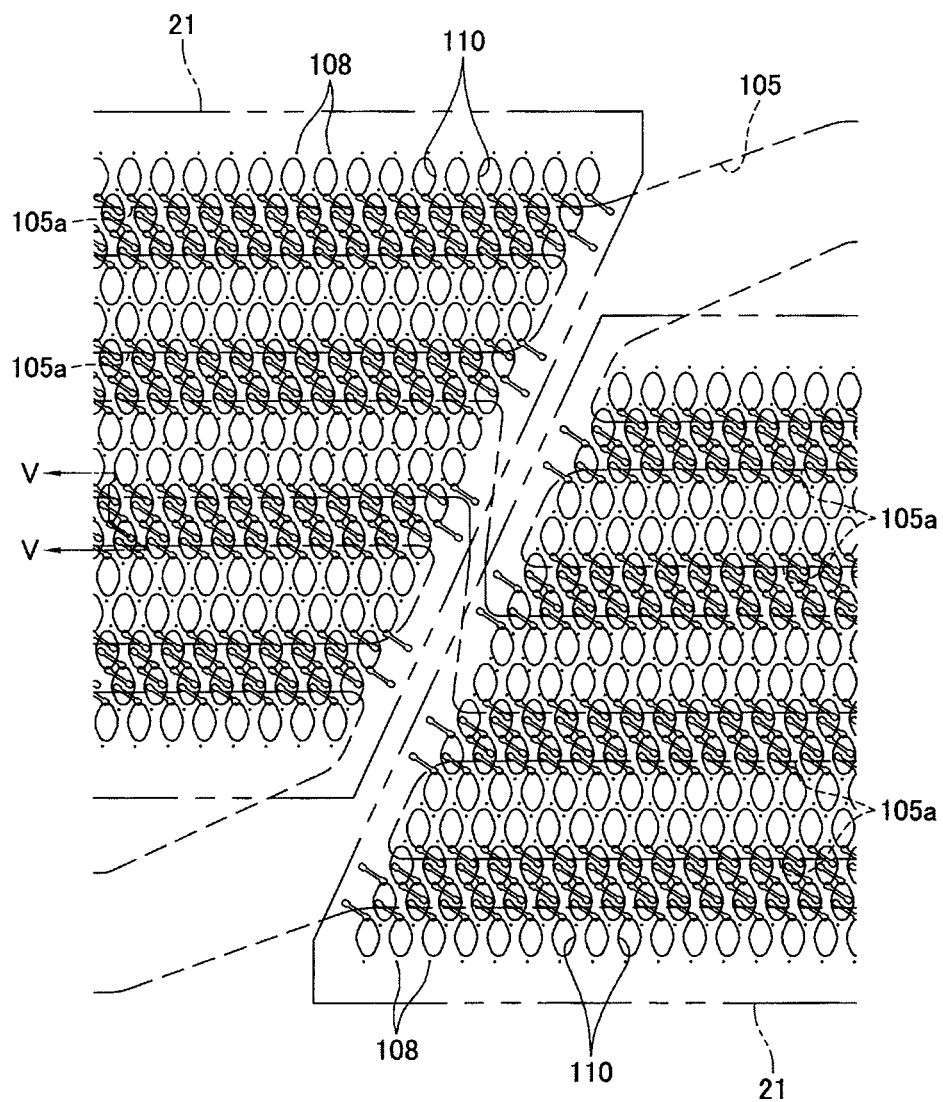
FIG. 4 is an enlarged view of an area surrounded by a long and short dash line shown in FIG. 2.
Figure 5:
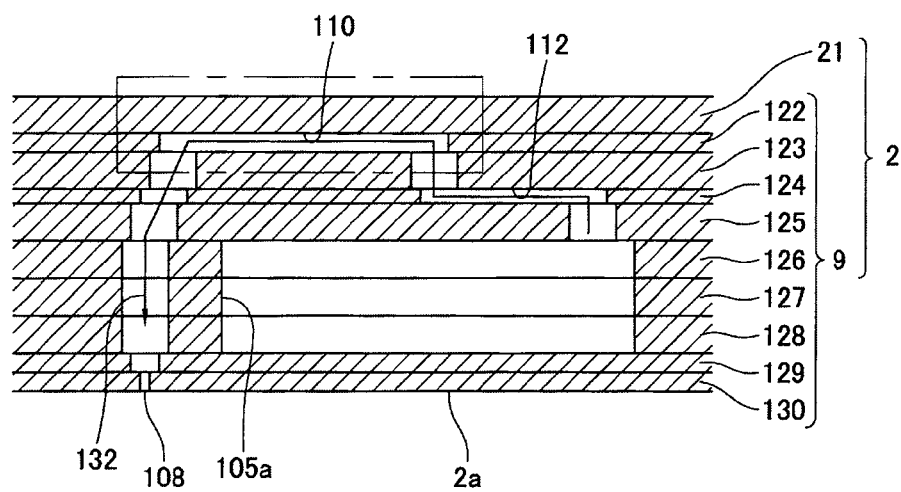
FIG. 5 is a cross-sectional view taken along the line V-V in FIG. 4.

Each ink-jet head 1 may include a head body 2 formed with a plurality of discharge ports 108 (see FIG. 4 and FIG. 5). Each discharge port 108 may be opened at a discharge surface 2a, which is a lower surface of the head body 2. The discharge surface 2a may oppose the transported paper P at a predetermined distance. The ink may be discharged from the respective discharge ports 108 under the control of the control unit 100, whereby an image may be formed on the upper surface of the paper P.

The transporting device 16 may include a plurality of e.g., two, belt rollers 6 and 7, a transporting belt 8, a tension roller 10, and a platen 18. The transporting belt 8 may be an endless belt which is wound around the rollers 6 and 7 so as to extend therebetween, and a tension may be applied thereto by the tension roller 10. The platen 18 may be positioned in an area inside the transporting belt 8, and may support the transporting belt 8 at a position opposing the ink-jet heads 1 at a distance suitable for image formation. The belt roller 7 may be a driving roller driven and rotated clockwise in FIG. 1 by a motor, not shown, and to cause the transporting belt 8 to travel. The belt roller 6 may be a driven roller which is rotated by the transporting belt 8. Accordingly, the transporting device 16 may transport the paper P, which is placed on the transporting belt 8, in the transport direction (i.e., from the left to the right in FIG. 1).

The paper feed unit 101b may be disposed to be mounted on and removed from the housing 101a. The paper feed unit 101b may include a paper feed tray 11 and a paper feed roller 12. The paper feed tray 11 may have a box shape opening upward, and may store the plurality of pieces of paper P in a stacked state. The paper feed roller 12 may feed the uppermost piece of paper P on the paper feed tray 11 under the control of the control unit 100. The fed paper P may be guided by guides 13a and 13b and fed to the transporting device 16 by a feed roller pair 14.

The tank unit 101c may include a plurality of, e.g., four, ink tanks 17 which are stored in the interior thereof. The ink tanks 17 may be removably mounted on the tank unit 101c. The respective ink tanks 17 may include ink in colors different from each other (e.g., cyan, magenta, yellow, and black). The ink in each ink tank 17 may be supplied to the corresponding ink-jet head 1 via an ink tube (not shown).

A transporting route may be formed in the interior of the ink-jet printer 101 (along black arrows shown in FIG. 1). The route may have generally an S-shape inverted in the lateral direction. When the paper P, which is fed from the paper feed unit 101b positioned below the transporting route, passes in front of the discharge surfaces 2a, the inks may be discharged from the plurality of, e.g., four, ink-jet heads 1 in sequence under the control of the control unit 100, whereby a desired color image may be formed on the upper surface of the paper P. The paper P formed with the image may be fed from the transporting device 16. The paper P may be fed by a feed roller pair 28 along guides 29a and 29b, and may be ejected from an output port 22 formed on the upper portion of the housing 101a onto the paper output portion 15.

Figure 2:
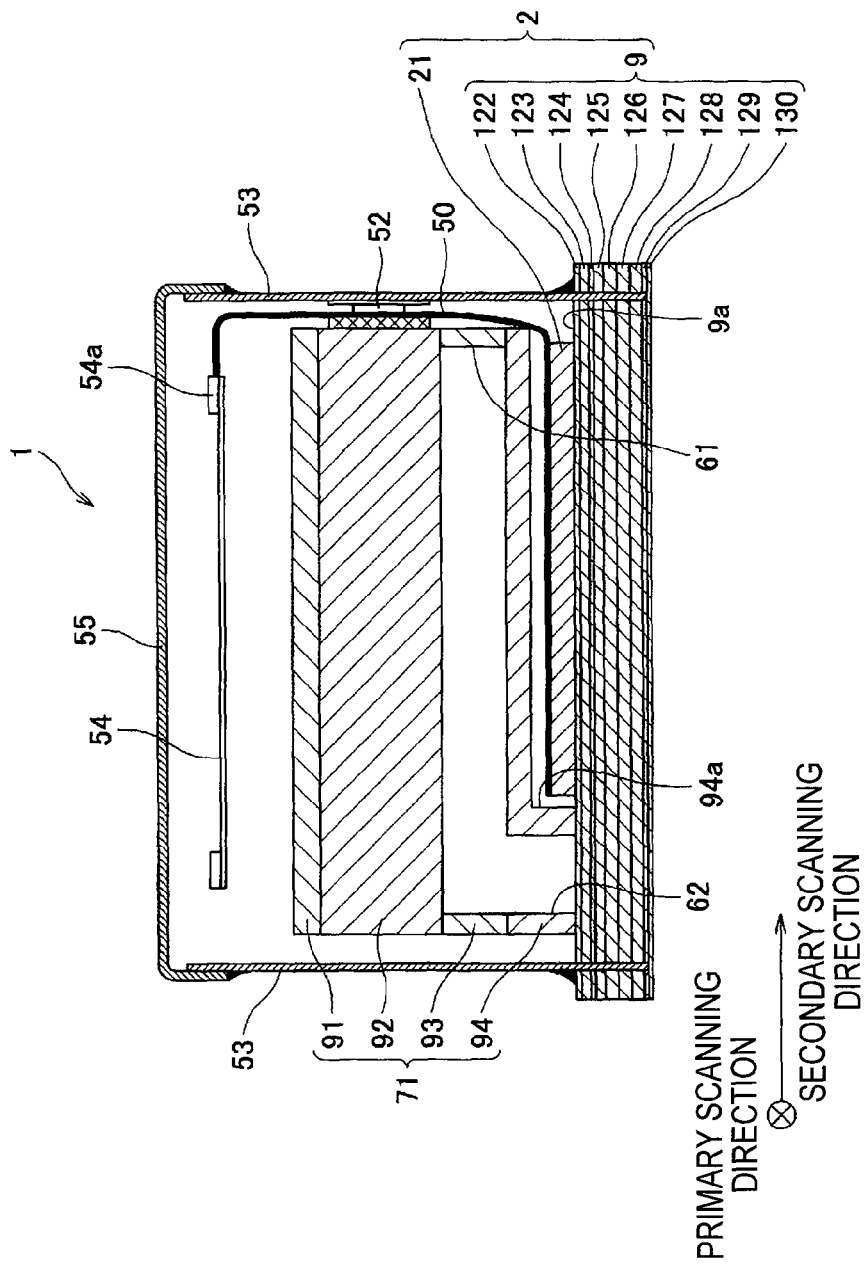
FIG. 2 is a cross-sectional view taken along the widthwise direction of an ink-jet head shown in FIG. 1.

Referring to FIG. 2, the plurality of e.g., four, ink-jet heads 1 may have the same configuration. The ink-jet head 1 may have a laminated structure including the head body 2 including a flow channel unit 9 and the actuator unit 21, a reservoir unit 71 which is configured to supply the ink to the head body 2, and a control board 54 having electronic components mounted thereon. The control board 54 and the actuator unit 21 may be electrically connected by a flat flexible substrate (i.e., COF (Chip On Film)) 50. A side cover 53 and a head cover 55 may be disposed on the flow channel unit 9. The actuator units 21, the reservoir unit 71, the COFs 50, and the control board 54 may be positioned in a space which is defined by the upper surface of the flow channel unit 9, the side cover 53 and the head cover 55, and ink mist may be prevented from entering therein from the outside.

The reservoir unit 71 may be a flow channel member including a plurality of, e.g., four, plates 91 to 94 laminated therein. The ink to be supplied to the flow channel unit 9 may be temporarily stored in the reservoir unit 71. An ink reservoir 61 to which the ink is supplied from the outside, and a plurality of, e.g., ten, ink outflow channels 62, which are branched from the ink reservoir 61, are disposed in the interior of the reservoir unit 71. In FIG. 2, only one of the ink outflow channels 62 is shown. The plate 93 may include the ink reservoir 61 as an ink trap. The plate 94 may include a plurality of e.g., ten, protrusions 94a which are disposed on the lower surface thereof. The ink outflow channel 62 may open at a position which is positioned at the distal end surface of the protrusions 94a. The distal end surfaces of the protrusions 94a may be joined to an upper surface 9a of the flow channel unit 9, such that the ink flow channels of the reservoir unit 71 and the flow channel unit 9 are communicated with each other. Depressed portions which are defined by the protrusions 94a on the lower surface of the plate 94 may form a clearance between the plate 94 and the flow channel unit 9, and a plurality of e.g., four, actuator units 21 are arranged in the clearance.

The COF 50 may be connected at one end thereof to the upper surface of the actuator unit 21, and at the other end thereof to a connector 54a on the control board 54. A driver IC 52 may be mounted on a midsection of the COF 50. The driver IC 52 may be in contact with an inner wall surface of the side cover 53. The side cover 53 may be a metal plate member, and may function as a heat-discharging plate with respect to the driver IC 52.

Figure 3:
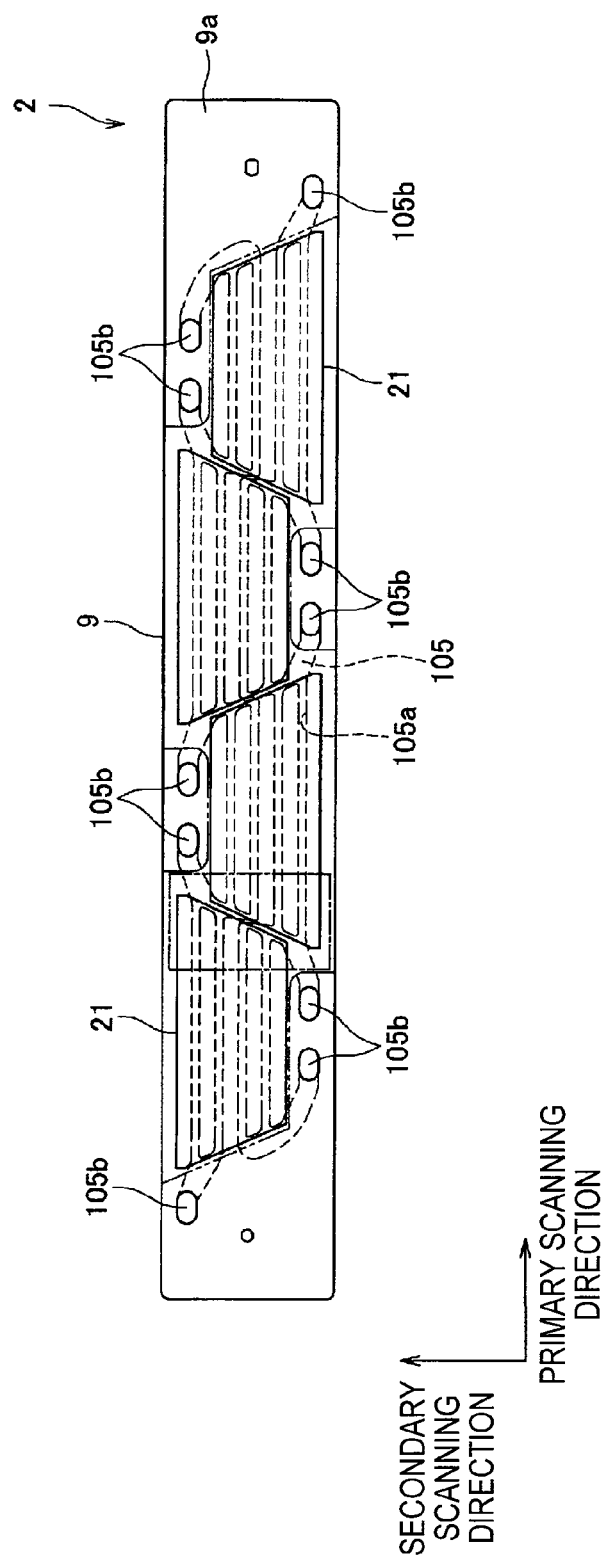
FIG. 3 is a plan view of a head body shown in FIG. 1.

Referring to FIG. 3, the head body 2 may include the flow channel unit 9, and the plurality of, e.g., four, actuator units 21 which are positioned on the upper surface 9a of the flow channel unit 9.

The flow channel unit 9 may be a flow channel member including a plurality of, e.g., nine, laminated plates 122 to 130. The flow channel unit 9 may have substantially the same size and shape as the plate 94 of the reservoir unit 71. The plates 122 to 130 each may be elongated in the primary scanning direction and may have a rectangular shape in plan view. Ink flow channels extending from ink supply ports 105b on the upper surface 9a to the discharge ports 108 of the lower surface (i.e., discharge surface 2a) may be formed in the interior of the laminated member. The ink flow channels may include, as shown in FIG. 3 to FIG. 5, a manifold flow channel 105 which is communicated at one end thereof to the ink supply port 105b, sub manifold flow channels 105a which are branched from the manifold flow channel 105, and a plurality of individual ink flow channels 132 extending from exits of the sub manifold flow channels 105a to the discharge ports 108 via the pressure chamber 110. Referring to FIG. 4, a plurality of pressure chambers 110 may be formed to open on the upper surface 9a, in addition to the plurality of ink supply ports 105b. The plurality of pressure chambers 110 may be arranged in a matrix pattern. The pressure chambers 110 and the ink supply ports 105b may be formed as holes penetrating through the plate 122 and the openings thereof, respectively. The discharge ports 108 of the same number as the pressure chambers 110 may be formed to open on the discharge surface 2a in a matrix pattern.

The ink which is supplied from the reservoir unit 71 into the flow channel unit 9 via the ink supply ports 105b may be distributed to the sub manifold flow channels 105a from the manifold flow channels 105. The ink in the sub manifold flow channels 105a may flow into the individual ink flow channels 132, and may reach the discharge ports 108 via the apertures 112 which function as throttles and the pressure chambers 110.

Referring back to FIG. 3, the plurality of e.g., four, actuator units 21 each may have a trapezoidal shape in plan view. The plurality of actuators may be arranged in a zigzag pattern in the primary scanning direction so as to avoid the ink supply ports 105b. The parallel opposite sides of each actuator unit 21 may extend along the primary scanning direction, and oblique sides of the adjacent actuator units 21 may be overlapped with each other in the transport direction.

Figure 6A:
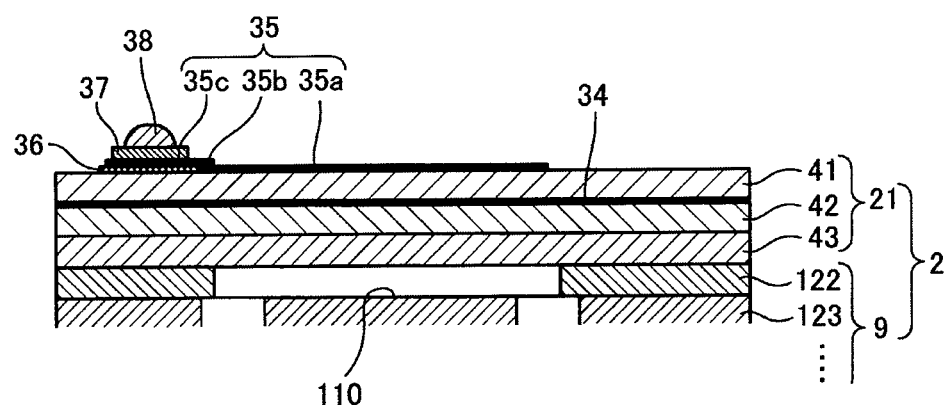
FIG. 6A is an enlarged view of the area surrounded by the long and short dash line shown in FIG. 5.
Figure 6B:
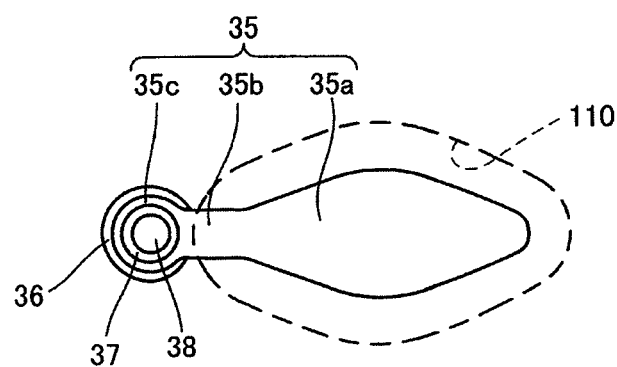
FIG. 6B is a plan view showing an individual electrode according to an illustrative embodiment.

Referring to FIG. 6A, the actuator unit 21 may include a plurality of, e.g., three, piezoelectric layers 41 to 43 which are configured of ceramic material based on lead zirconate titanate (i.e., PZT) having ferroelectric characteristics. Individual electrodes 35 respectively overlapping the plurality of pressure chambers 110 may be disposed on the surface of the uppermost piezoelectric layer 41 as shown in FIGS. 6A and 6B. A common electrode 34 which is formed over the entire surface of the sheet may be positioned between the piezoelectric layer 41 and the piezoelectric layer 42 on the lower side of the piezoelectric layer 41.

Referring to FIG. 6B, the individual electrode 35 may include a main electrode portion 35a arranged so as to overlap the pressure chambers 110, a connecting portion 35b which is led from the main electrode portion 35a, and a terminal portion 35c which is positioned at the distal end of the connecting portion 35b. The main electrode portion 35a may have a similar shape to the pressure chambers 110, and may have substantially a diamond shape slightly smaller than that in plan view. The connecting portion 35b may be led from one of the acute angle portions of the main electrode portion 35a, and the distal end portion thereof may not overlap the pressure chambers 110 as illustrated in FIGS. 6A and 6B. The terminal portion 35c may have a circular shape in plan view. In this illustrative embodiment, the terminal portion 35c may not overlap the pressure chambers 110 as well.

The individual electrode 35 may be disposed by baking conductive paste which includes Au as a main ingredient. In addition to Au, metal fine particles of Ag, Ag—Pd may be included as materials of the individual electrode 35. Such materials may be used in the form of paste containing these metal fine particles.

Metal layers 36 may be disposed between the respective terminal portions 35c and the piezoelectric layer 41. The metal layer 36 may be slightly larger than the terminal portion 35c, and may have a circular shape in plan view. In this manner, the metal layer 36 and the terminal portion 35c may be laminated in sequence on the piezoelectric layer 41. The metal layer 36 may not overlap the pressure chambers 110 as well. The metal layer 36 may be formed by Vacuum Vapor Deposition using either one of Ti, Ni, and Cr as a deposition material. The method of forming the metal layer 36 is not limited to Vacuum Vapor Deposition as other methods such as Physical Vapor Deposition (PVD) or Chemical Vapor Deposition (CVD) may also be used.

A land 37 may be disposed on each terminal portion 35c. The land 37 may be slightly smaller than the terminal portion 35c, and may have a circular shape in plan view. The land 37 may be disposed by baking conductive paste formed of Ag—Pd as a main ingredient. In addition to Ag—Pd, the metal fine particles of Ag, Au may be included as a material of the land 37, and may be used in the form of paste containing these metal fine particles.

A bump 38 which has a convex shape and is configured of a metal material containing Ag may be disposed on each land 37. The bump 38 may be slightly smaller than the land 37, and may have a circular shape in plan view. The outline may be a semispherical shape as shown in FIG. 6A. In this manner, the metal layer 36, the terminal portion 35c, the land 37, and the bump 38 may be stacked on the piezoelectric layer 41 substantially coaxially. Referring to FIG. 6B, in plan view, the bump 38 may be contained in the land 37, the land 37 may be contained in the terminal portion 35c, and the terminal portion 35c may be contained in the metal layer 36. The bump 38 may be disposed by baking conductive paste which includes Ag as a main ingredient. In addition to Ag, the metal particles of Au, and Ag—Pd may be included as the material of the bump 38, and may be used in the form of paste containing these metal fine particles.

The bump 38 may be a contact point with respect to a terminal of the COF 50. The individual electrode 35 may be connected individually with an output terminal of the driver IC 52 via the bump 38. A driving signal may be selectively supplied thereto via the wiring of the COF 50. When the driving signal is supplied to the individual electrode 35, portions of the actuator unit 21 corresponding to the individual electrodes 35 may be deformed independently. Portions overlapped with the individual electrodes 35 may function as individual actuators. In this manner, the actuator unit 21 may be an integral driving element group, and may include actuators of the same number as the pressure chambers 110 integrated therein.

In the actuator unit 21, the uppermost piezoelectric layer 41 may be polarized in the direction of thickness. Portions of the piezoelectric layer 41 which are interposed between the individual electrode 35 and the common electrode 34 may be displaced by the application of electric field. The active portions may be displaced in at least one vibration mode selected from $d_{31}$, $d_{33}$, and $d_{15}$. In this illustrative embodiment, the active portions may be displaced in the vibration mode of $d_{31}$. Portions of the piezoelectric layers 42 and 43 opposing the individual electrodes 35 may not deform even when the electric field is applied. Each actuator in this combination may be a piezoelectric element of a type having a so-called unimorph-structure.

The common electrode 34 may be connected to the ground such that a reference potential is equally applied to the areas corresponding to all the pressure chambers 110. When the individual electrode 35 is controlled to a predetermined positive or negative potential and an electric field in the direction of polarization is applied to the active portions, the active portions may contract in the direction orthogonal to the direction of polarization (i.e., direction of plane) by a piezoelectric lateral effect. In contrast, the piezoelectric layers 42 and 43 may not spontaneously deform even though the electric field is applied, and hence the difference in distortion may occur between the upper piezoelectric layer 41 and the lower piezoelectric layers 42 and 43. With this difference in distortion, the entire piezoelectric layers 41 to 43 may be ready to deform in a convex shape toward the pressure chamber 110 (i.e., unimorph deformation).

Here, since the piezoelectric layers 41 to 43 are fixed to the upper surface of the cavity plate 122 which sectionalizes the pressure chambers 110, areas corresponding to the active portions (i.e., individual actuators) may deform in a convex shape toward the pressure chambers 110. At this time, the capacities of the pressure chambers 110 may be reduced, a pressure (i.e., discharge energy) may be applied to the ink in the respective pressure chambers 110, and ink drops may be discharged from the discharge ports 108. Subsequently, when the potentials of the individual electrode 35 are returned to the same potential as the common electrode 34, the areas corresponding to the active portions may be restored to their original shapes, and the capacities of the pressure chambers 110 may return to the original capacities, such that the ink is sucked from the manifold flow channel 105 into the pressure chambers 110.

As another method of driving, a method of controlling the individual electrodes 35 to potentials different from that of the common electrode 34 in advance, bringing the potentials of the individual electrodes 35 into the same potentials as the common electrode 34 once upon receipt of a discharge request, and bringing the potentials of the individual electrodes 35 to the potentials different from that of the common electrode 34 after the elapse of a predetermined time period is also applicable. In this case, in the initial state, the areas corresponding to the active portions may be deformed into a convex shape toward the pressure chambers 110. Upon receipt of the discharge request, the areas corresponding to the active portions may become a flat shape at the same timing as the potentials of the individual electrodes 35 become the same as that of the common electrode 34, and the capacities of the pressure chambers 110 may be increased in comparison with the initial state. At this time, the ink may be sucked into the pressure chambers 110 from the manifold flow channel 105. Subsequently, the areas corresponding to the active portions may deform into a convex shape toward the pressure chambers 110 at the timing when the potentials of the individual electrodes 35 assume the potentials different from that of the common electrode 34 again. Accordingly, the pressures which are applied to the ink may be increased due to the decrease of the capacities of the pressure chambers 110, such that the ink is discharged.

Referring to FIG. 7 and FIG. 8, in order to manufacture the head body 2, the flow channel unit 9 and the actuator units 21 may be fabricated separately, and then may be assembled with an adhesive agent. In order to manufacture the actuator unit 21, the piezoelectric layers 41 to 43 of the laminated member may be configured first. When configuring the piezoelectric layers 41 to 43, green sheets having predetermined shape and size using piezoelectric ceramics powder may be configured. A plurality of through holes may be formed on the green sheet at a peripheral edge portion thereof for fabricating the piezoelectric layer 41. A common electrode pattern may be formed on the green sheet by a screen printing process for fabricating the piezoelectric layer 42. The common electrode pattern may occupy the substantially entire part of the upper surface of the green sheet. Subsequently, these plurality of, e.g., two, green sheets may be laminated with the green sheet with the electrode pattern formed thereon placed therebetween, such that a precursor of the piezoelectric layers 41 to 43 including the plurality of, e.g., three, green sheets may be disposed. On the electrode pattern, the green sheet having the through holes may be laminated. The through holes may be opened with respect to the common electrode pattern. After having configured the precursor, the conductive paste may be filled into the through holes. For example, Ag—Pd based paste may be used. Then, the precursor may be degreased and baked (e.g., 900 to 1000° C.), such that the piezoelectric layers 41 to 43 are obtained.

Figure 7A:
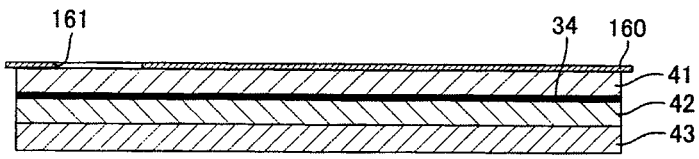
FIG. 7A is a cross-sectional view showing a step of forming a metal layer shown in FIG. 6A in a method of manufacturing the head body according to an illustrative embodiment.

Referring to FIG. 7A, a mask 160 may be used to form the metal layer 36 by Vacuum Vapor Deposition. More specifically, the metal layer 36 may be formed using a Vacuum Vapor Deposition apparatus. First, the baked piezoelectric layers 41 to 43 which are covered with the mask 160 on the surface of the piezoelectric layer 41 may be supported in a vacuum chamber of the apparatus. Pellets of Ti, Ni, or Cr as a deposition source may be set so as to oppose the piezoelectric layers 41 to 43. When the vacuum in the vacuum chamber reaches $10^{-3}$ to $10^{-4}$ Pa, the pellets may be evaporated by resistance heating or electron beam heating. The mask 160 may be formed with circular openings 161 which are arranged in a matrix pattern. Since the evaporated particles fly linearly in the vacuum chamber, the metal layers 36 may be disposed on the upper surface of the piezoelectric layer 41 in the same circular shape in plan view as the openings 161. Deposited metal films may be high in purity and also in flexibility.

Figure 7B:
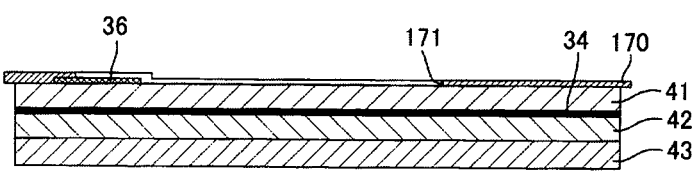
FIG. 7B is a cross-sectional view showing a step of forming the individual electrode shown in FIG. 6A in the method of manufacturing the head body according to the illustrative embodiment.
Figure 8A:
FIG. 8A is a plan view showing a state in which the metal layer shown in FIG. 6B is disposed in a method of manufacturing the actuator unit according to an illustrative embodiment.
Figure 8B:
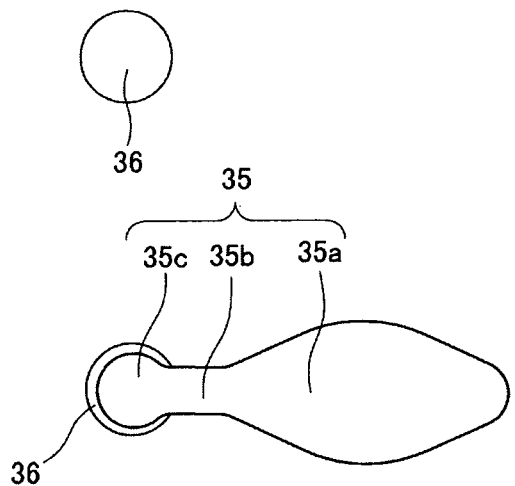
FIG. 8B is a plan view showing a state in which the individual electrode in FIG. 6B is disposed in the method of manufacturing the actuator unit according to the illustrative embodiment.

Referring to FIG. 7B, an electrode arrangement pattern may be formed on the surface of the piezoelectric layer 41 by the screen printing process. A mask 170 for printing may include openings 171 which are formed in a matrix pattern. The openings 171 may have a shape corresponding to the individual electrode 35 (i.e., the main electrode portions 35a, the connecting portions 35b, and the terminal portions 35c). Prior to the printing, the mask 170 may be registered with the piezoelectric layers 41 to 43 such that the portions of the terminal portion 35c of the mask 170 are contained in the metal layers 36, respectively. The Au based conductive paste may be used for the printing. After the printing, baking may be performed at a temperature from 500 to 1000° C. Accordingly, the individual electrodes 35 corresponding to the mask pattern may be formed as shown in FIG. 8B. The terminal portions 35c of the individual electrodes 35 may be contained in the metal layers 36 respectively in plan view, and parts of the connecting portions 35b and the terminal portions 35c may be superimposed on the metal layers 36. The main electrode portions 35a and the remaining part of the connecting portions 35b may be disposed on the surface of the piezoelectric layer 41. The thickness of the individual electrodes 35 may be on the order of 0.1 to 1 μm.

Figure 7C:
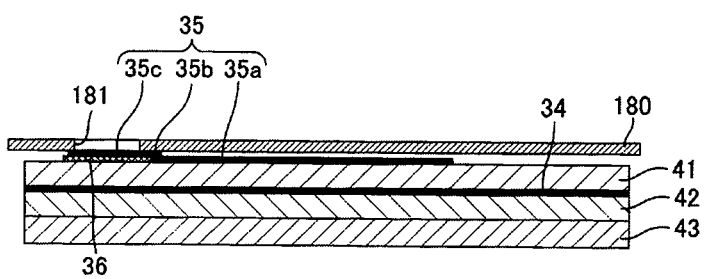
FIG. 7C is a cross-sectional view showing a step of forming a land shown in FIG. 6A in the method of manufacturing the head body according to the illustrative embodiment.
Figure 8C:
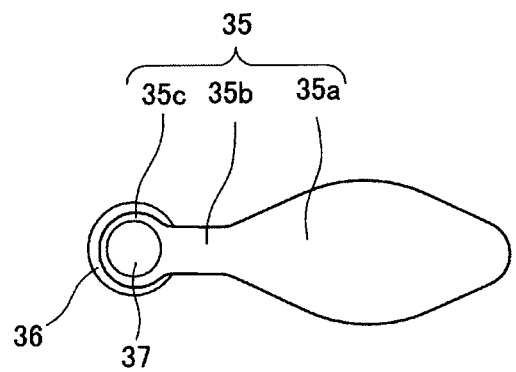
FIG. 8C is a plan view showing a state in which the land is disposed in the method of manufacturing the actuator unit according to the illustrative embodiment.

Referring to FIG. 7C, an electrode arrangement pattern may be formed on the terminal portion 35c by the screen printing process. A mask 180 for printing may include openings (not shown) corresponding to the lands of the common electrode 34, in addition to circular openings 181 corresponding to the lands 37. The openings 181 may be arranged in a matrix pattern. The openings corresponding to the lands of the common electrode 34 may be arranged so as to surround the openings 181 for the lands 37 from four sides. The openings corresponding to the lands for the common electrode 34 may be elongated along the opposed parallel sides of the trapezoids. Prior to printing, the mask 180 may be registered with the piezoelectric layers 41 to 43 such that the portions of the mask 180 corresponding to the lands 37 are contained in the terminal portions 35c respectively. At this time, the openings corresponding to the lands for the common electrode 34 may oppose the through holes (not shown) of the piezoelectric layer 41. Ag—Pd based paste may be used for printing. After printing, baking may be performed at a temperature from 500 to 1000° C. Accordingly, the lands 37 corresponding to the mask pattern may be formed as shown in FIG. 8C. The lands 37 may be contained in the terminal portions 35c of the individual electrodes 35 respectively in plan view. The lands for the common electrodes 34 may be superimposed on the conductive members which are filled in the through holes of the piezoelectric layer 41, and may be electrically connected to the common electrode 34. The thickness of the lands 37 may be on the order of 10 μm.

Figure 7D:
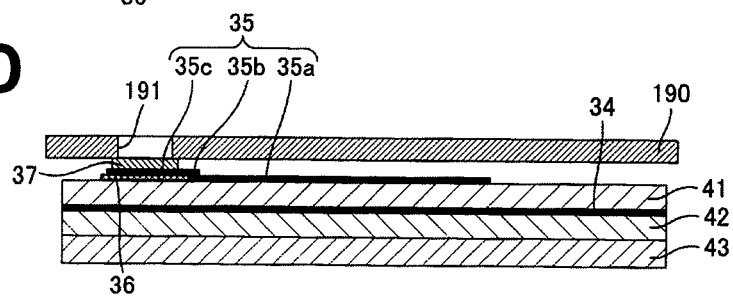
FIG. 7D is a cross-sectional view showing a step of forming a bump shown in FIG. 6A in the method of manufacturing the head body according to the illustrative embodiment.
Figure 8D:
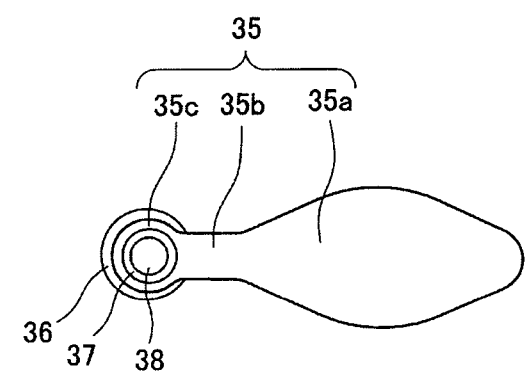
FIG. 8D is a plan view showing a state in which the bump is disposed in the method of manufacturing the actuator unit according to the illustrative embodiment.

Referring to FIG. 7D, an electrode arrangement pattern may be formed on the lands 37 by the screen printing process. A mask 190 for printing may include openings corresponding to the bumps of the common electrode, in addition to circular openings 191 corresponding to the bumps 38. The openings corresponding to the both bumps may be arranged in the same manner as the openings corresponding to the both lands. The size may be slightly smaller than the openings of the respective lands. Prior to the printing, the mask 190 may be registered with the piezoelectric layers 41 to 43 such that the portions of the mask 190 corresponding to the bumps 38 are contained in the lands 37 respectively. At this time, the openings corresponding to the bumps for the common electrode 34 may oppose the through holes of the piezoelectric layer 41. The Ag based conductive paste may be used for the printing. After the printing, baking may be performed at a temperature from 100 to 200° C. The electrode arrangement pattern may be hardened by this baking. Accordingly, the bumps 38 corresponding to the mask pattern may be disposed as shown in FIG. 8D. The bumps 38 may be contained in the lands 37 respectively in plan view. The height of the bump 38 from the surface of the piezoelectric layer 41 may be on the order of 50 μm.

Figure 7E:
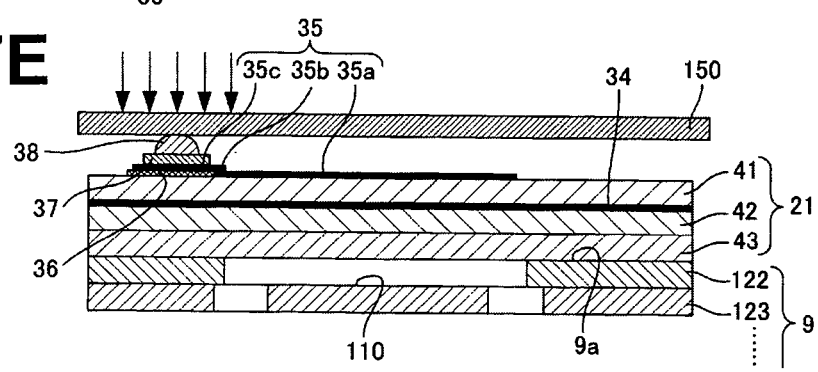
FIG. 7E is a cross-sectional view showing a step of fixing an actuator unit to a flow channel unit shown in FIG. 6A in the method of manufacturing the head body according to the illustrative embodiment.

As described above, the actuator unit 21 may be completed by disposing the metal layers 36, the individual electrodes 35, the lands 37, and the bumps 38 on the surface of the piezoelectric layer 41. Aside from the actuator units 21, the flow channel unit 9 may be configured by laminating the plates 122 to 130 and joining the same with respect to each other. They may be joined by using a heat curing adhesive agent. Referring to FIG. 7E, the actuator units 21 may be laminated on the upper surface 9a of the flow channel unit 9 via the heat curing adhesive agent (not shown). At this time, the actuator units 21 and the flow channel unit 9 may be registered such that the main electrode portions 35a of the respective individual electrodes 35 overlap the pressure chambers 110, and the respective metal layers 36 may not oppose the pressure chambers 110. At this time, the terminal portions 35c, the lands 37, and the bump 38, which are contained in the metal layers 36 respectively in plan view, may not overlap the pressure chambers 110.

Then, by applying a pressure toward the metal layers 36 against the distal ends of the bumps 38 in the convex shape by a jig 150, the actuator units 21 and the flow channel unit 9 may be heated while compressing in the direction toward each other. Accordingly, the actuator units 21 may be secured to the flow channel unit 9, and the head body 2 may be completed.

The reservoir unit 71, the COFs 50, the control board 54, the side cover 53 and the head cover 55 may be prepared according to respective manufacturing procedures separately.

The COFs 50 may be attached to the head body 2 so as to be joined with the actuator units 21. Joint terminals, which are connected to the respective output terminals of the driver IC 52 may be arranged in the joint areas of the COFs 50. The joint may be achieved by heating the joint terminals (e.g., on the order of 200° C.) while compressing the same to the corresponding bumps 38. The form of the joint portions here may be such that the joint terminals are joined with the bumps 38 by soldering, or peripheries of the joint terminal and the bumps 38, which come into contact with each other, are coated with heat curing adhesive agent. These forms may be combined with each other.

Subsequently, the reservoir unit 71 may be joined to the head body 2. At this time, the protrusions 94a which are disposed on the plate 94 of the reservoir unit 71 may be positioned so as to oppose the ink supply ports 105b of the head body 2. The joint of the both members may be achieved by the heat curing adhesive agent interposed therebetween.

The control board 54 may be disposed above the reservoir unit 71, and the other ends of the COFs 50 may be connected to the connectors 54a on the control board 54. The side cover 53 may be disposed on the flow channel unit 9. At this time, the side cover 53 may be arranged such that the drivers IC come into contact with the inner wall surface thereof. A boundary between the side cover 53 and the flow channel unit 9, and a boundary between the side cover 53 and side cover 55 may be sealed by a potting agent (not labeled) formed of silicon. The ink-jet head 1 may be completed with the procedures described above.

As described above, according to the actuator units 21 which are provided in the ink-jet head 1, even when a crack occurs, the crack may be restrained from propagating beyond the metal layer 36. Therefore, occurrence of the crack spanning the piezoelectric layer 41 and the bump 38 may be prevented. Consequently, even when inexpensive silver-based material is employed for the bumps 38, the probability of occurrence of deteriorated insulation of the actuator units 21 in association with migration of the silver element which constitutes the bumps 38 may be reduced.

Although the description of the illustrative embodiments has been given thus far, the disclosure is not limited to the above described illustrative embodiments. Various modifications may be possible.

For example, in the above described illustrative embodiments, the metal layers 36 are disposed on the surface of the piezoelectric layer 41, and the parts of the connecting portion 35b and the terminal portions 35c of the individual electrode 35 are superimposed on the metal layers 36. However, a configuration in which the positional relationship between the individual electrodes 35 and the metal layers 36 in the vertical direction is inverted, all the individual electrodes 35 are formed on the surface of the piezoelectric layer 41, and the metal layers 36 are superimposed on the terminal portions 35c of the individual electrodes may be applicable.

In the above described illustrative embodiments, the bumps 38 are contained in the individual electrodes 35 and the metal layers 36 respectively in plan view. However, the bumps 38 may not be contained in the individual electrodes 35, but contained in the metal layers 36.

In the above described illustrative embodiments, the bumps 38 are contained in the lands 37, respectively, in plan view, and the lands 37 are contained in the metal layers 36 respectively. However, the lands 37 may not have to be formed.

In the above described illustrative embodiments, the metal layers 36 include any one of Ti, Ni, and Cr. However, the metal layers 36 may include other metal substance.

In the above described illustrative embodiments, the metal layers 36 do not overlap the pressure chambers 110. However, the metal layers 36 may overlap the pressure chambers 110. Also, each metal layer 36 may have the size and shape containing the entire individual electrode 35.

In the above described illustrative embodiments, the actuator units 21 include the laminated member including three piezoelectric layers altogether including one active layer. However, the laminated member may include two layers and not include the piezoelectric layer 43. Alternatively, the laminated member may include four or more multiple layers. In this case, there may be a plurality of layers including the active layer.

In the above described illustrative embodiments, the example is applied to the ink-jet head 1 which is configured to discharge the ink from the discharge ports 108. However, the disclosure may be applied to a liquid discharging head which is configured to discharge liquid other than the ink. Furthermore, the disclosure may be applied to the piezoelectric actuator which is configured to drive driving units of various apparatuses.

While the invention has been described in connection with various illustrative structures and illustrative embodiments, it will be understood by those skilled in the art that other variations and modifications of the structures and illustrative embodiments described above may be made without departing from the scope of the invention. Other structures and embodiments will be apparent to those skilled in the art from a consideration of the specification or practice of the invention disclosed herein. It is intended that the specification and the described examples are illustrative with the true scope of the invention being defined by the following claims.

What is claimed is:

1. A piezoelectric actuator comprising:
    a piezoelectric layer;
    an electrode layer which is directly disposed on a surface of the piezoelectric layer;
    a metal terminal which is disposed on the electrode layer and configured as a contact point with respect to an external terminal;
    a first metal layer which is conductive and high in purity and disposed between the piezoelectric layer and each of the metal terminal and the electrode layer and disposed in contact with the piezoelectric layer and the electrode layer; and
    a second metal layer disposed between the metal terminal and the electrode layer.

2. The piezoelectric actuator according to claim 1, wherein the metal terminal is contained in the first metal layer, when viewed in a direction orthogonal to the surface of the piezoelectric layer.

3. The piezoelectric actuator according to claim 1, wherein the metal terminal is contained in the electrode layer, when viewed in a direction orthogonal to the surface of the piezoelectric layer.

4. The piezoelectric actuator according to claim 1, wherein the metal terminal is contained in the second metal layer and the second metal layer is contained in the first metal layer, when viewed in a direction orthogonal to the surface of the piezoelectric layer.

5. The piezoelectric actuator according to claim 1, wherein the first metal layer includes one of Ti, Ni, and Cr.

6. The piezoelectric actuator according to claim 1, further comprising:
    a plurality of electrode layers including the electrode layer, the plurality of electrode layers being disposed on the surface of the piezoelectric layer;
    a plurality of metal terminals including the metal terminal; and
    a plurality of first metal layers including the first metal layer,
    wherein one of the metal terminals and one of the first metal layers are disposed on each of the plurality of electrode layers.

7. The piezoelectric actuator according to claim 6, further comprising a common electrode layer, wherein each of the plurality of electrode layers overlaps the common electrode layer.

8. A liquid discharge head comprising:
    a flow channel unit comprising a plurality of individual liquid flow channels each including a respective discharge port, which is configured to discharge liquid, and a plurality of pressure chambers; and
    a piezoelectric actuator disposed on the flow channel unit including
        a piezoelectric layer;
        a plurality of electrode layers disposed directly on a surface of the piezoelectric layer;
        a plurality of metal terminals each being disposed on a respective one of the electrode layers and being electrically connected to the respective electrode layer, and each metal terminal being configured as a contact point with respect to an external terminal;
        a plurality of metal layers conductive and high in purity, each being disposed between the piezoelectric layer and respective ones of the metal terminals and the electrode layers and disposed in contact with the piezoelectric layer and the respective ones of the electrode layers, wherein the plurality of metal layers do not overlap the plurality of pressure chambers; and
        a common electrode layer, wherein each of the plurality of electrode layers overlaps the common electrode layer.

9. A method of manufacturing a piezoelectric actuator comprising the steps of:
    depositing a first metal layer, which is conductive and high in purity, on a surface of a piezoelectric layer by vapor deposition;
    baking an electrode layer on the surface of the first metal layer; and
    baking a metal terminal on the electrode layer so as to be electrically connected to the electrode layer.

10. The method of manufacturing the piezoelectric actuator according to claim 9, wherein the baking of the metal terminal includes baking the metal terminal to be contained in the first metal layer when viewed in a direction orthogonal to the surface of the piezoelectric layer.

11. The method of manufacturing the piezoelectric actuator according to claim 10, wherein the baking of the metal terminal includes baking the metal terminal to be contained in the electrode layer when viewed in the direction orthogonal to the surface of the piezoelectric layer.

12. The method of manufacturing the piezoelectric actuator according to claim 11, further comprising a step of baking a second metal layer on the electrode layer, wherein the step of baking the metal terminal on the electrode layer includes baking the metal terminal on the second metal layer.

13. The method of manufacturing the piezoelectric actuator according to claim 12, wherein
    the baking of the metal terminal includes baking the metal terminal to be contained in the second metal layer when viewed in the direction orthogonal to the surface of the piezoelectric layer, and
    the baking of the second metal layer includes baking the second metal layer to be contained in the first metal layer when viewed in the direction orthogonal to the surface of the piezoelectric layer.

14. A method of manufacturing a liquid discharge head comprising a flow channel unit comprising the steps of:
　forming a piezoelectric actuator including;
　　depositing a metal layer, which is conductive and high in purity, on a surface of a piezoelectric layer by vapor deposition;
　　baking an electrode layer on the surface of the metal layer; and
　　baking a metal terminal on the electrode layer; and
　laminating the piezoelectric actuator on a surface of a flow channel unit such that the electrode layer overlaps a pressure chamber and the metal terminal overlaps a portion of the flow channel unit other than the pressure chamber.

* * * * *